United States Patent [19]

Wu et al.

[11] Patent Number: 5,922,142
[45] Date of Patent: Jul. 13, 1999

[54] PHOTOVOLTAIC DEVICES COMPRISING CADMIUM STANNATE TRANSPARENT CONDUCTING FILMS AND METHOD FOR MAKING

[75] Inventors: Xuanzhi Wu, Golden; Timothy J. Coutts; Peter Sheldon, both of Lakewood; Douglas H. Rose, Golden, all of Colo.

[73] Assignee: Midwest Research Institute

[21] Appl. No.: 08/746,798

[22] Filed: Nov. 18, 1996

Related U.S. Application Data

[63] Continuation-in-part of application No. 08/740,347, Nov. 7, 1996.

[51] Int. Cl.⁶ .................................................. H01L 31/00
[52] U.S. Cl. .......................................... 136/260; 136/256
[58] Field of Search ........................................ 136/256, 260

[56] References Cited

U.S. PATENT DOCUMENTS

| | | | |
|---|---|---|---|
| 4,542,578 | 9/1985 | Yamano et al. | 29/572 |
| 4,581,108 | 4/1986 | Kapur et al. | 204/37.1 |
| 4,595,790 | 6/1986 | Basol | 136/256 |
| 4,595,791 | 6/1986 | Basol et al | 136/256 |
| 4,633,033 | 12/1986 | Nath et al. | 136/256 |
| 4,647,711 | 3/1987 | Basol et al. | 136/256 |
| 4,680,422 | 7/1987 | Stanbery | 136/249 |
| 4,710,589 | 12/1987 | Meyers et al. | 136/258 PC |
| 4,808,242 | 2/1989 | Murata et al. | 136/244 |
| 4,940,495 | 7/1990 | Weber et al. | 136/256 |
| 4,977,097 | 12/1990 | Meyers et al. | 437/4 |
| 5,261,968 | 11/1993 | Jordan | 136/256 |
| 5,268,039 | 12/1993 | Vogeli et al. | 136/256 |
| 5,304,499 | 4/1994 | Bonnet et al. | 437/5 |
| 5,472,910 | 12/1995 | Johnson et al. | 437/185 |

*Primary Examiner*—Mark Chapman
*Attorney, Agent, or Firm*—Ken Richardson

[57] ABSTRACT

A photovoltaic device having a substrate, a layer of $Cd_2SnO_4$ disposed on said substrate as a front contact, a thin film comprising two or more layers of semiconductor materials disposed on said layer of $Cd_2SnO_4$, and an electrically conductive film disposed on said thin film of semiconductor materials to form a rear electrical contact to said thin film. The device is formed by RF sputter coating a $Cd_2SnO_4$ layer onto a substrate, depositing a thin film of semiconductor materials onto the layer of $Cd_2SnO_4$, and depositing an electrically conductive film onto the thin film of semiconductor materials.

32 Claims, 6 Drawing Sheets

~*180X*

84μm

PHOTOVOLTAIC DEVICES COMPRISING CADMIUM STANNATE TRANSPARENT CONDUCTING FILMS AND METHOD FOR MAKING

CROSS-REFERENCE TO OTHER APPLICATIONS

This patent application is a continuation-in-part of U.S. patent application Ser. No. 08/740,347 filed Nov. 7, 1996, and entitled Thin Transparent Conducting Films of Cadmium Stannate.

CONTRACTUAL ORIGIN OF THE INVENTION

The United States Government has rights in this invention under Contract No. DE-AC36-83CH10093 between the U.S. Department of Energy and the National Renewable Energy Laboratory, a Division of Midwest Research Institute.

BACKGROUND OF THE INVENTION

1. Field of the Invention

The present invention relates generally to photovoltaic devices and more particularly to thin film solar cells comprising a thin transparent conducting film of cadmium stannate.

2. Description of the Prior Art

Photovoltaic devices, used extensively in a myriad of applications, have generated considerable academic and commercial interest in recent years. Photovoltaic devices (solar cells) utilize the specific conductivity properties of semiconductors to convert the visible and near visible light energy of the sun into usable electrical energy. This conversion results from the absorption of radiant energy in the semiconductor materials which frees some valence electrons, thereby generating electron-hole pairs. The energy required to generate electron-hole pairs in a semiconductor material is referred to as the band gap energy, which in general is the minimum energy needed to excite an electron from the valence band to the conduction band.

Cadmium telluride (CdTe) has long been recognized as a promising semiconductor material for thin-film solar cells due to its near-optimum band gap of 1.5 eV and high absorption coefficient. CdTe is typically coupled with a second semiconductor material of different conductivity type such as cadmium sulfide (CdS) to produce a high efficiency heterojunction photovoltaic cell. Small-area CdS/CdTe heterojunction solar cells with solar energy to electrical energy conversion efficiencies of more than 16% and commercial-scale modules with efficiencies of about 9% have been produced using various deposition techniques, including close-space sublimation or "CSS" (U.S. Pat. No. 5,304,499, issued Apr. 19, 1994, to Bonnet et al.), spray deposition (e.g., J. F. Jordan, *Solar Cells*, 23 (1988) pp. 107–113), and electrolytic deposition (e.g., B. M. Basol, *Solar Cells*, 23 (1988), pp. 69–88).

Thin film solar cells typically comprise an optically transparent substrate through which radiant energy enters the device, the intermediate layers of dissimilar semiconductor materials (e.g., CdS and CdTe), and a conductive film back contact. Generally, when the substrate is not electrically conductive, a thin layer of transparent conductive oxide (TCO) is deposited between the substrate and the first semiconductor layer to function as a front contact current collector. However, conventional TCOs, such as tin oxide, indium oxide, and zinc oxide, have high sheet resistivities (typically about 10 ohms per square), and hence poor conductivity, at thicknesses necessary for good optical transmission. Thus, because of their high sheet resistivities, conventional TCOs are not efficient current collectors in solar cells of any appreciable size (i.e., greater than about one square centimeter), particularly in commercial-scale modules.

One way around the current collection limitation described above is to incorporate a more efficient current collection means, such as a front contact current collector grid, into the TCO layer. These current collector grids generally comprise a network of very low resistivity material that collects electrical current from the transparent conductive layer and channels the current to a central current collector. For example, U.S. Pat. Nos. 4,647,711, 4,595,790 and 4,595,791 to Basol et al. each disclose a photovoltaic device having a metallic conductive grid integrated into the TCO layer to decrease the series resistance of the device. Although supplementing the TCO layer with a metallic grid may theoretically enhance the current collecting capacity of the solar cell, because the grid material is not optically transparent, the presence of the grid can actually reduce the overall conversion efficiency of the photovoltaic device. Other disadvantages and potential problems commonly associated with the use of current collector grids include diffusion of the grid material into the semiconductor layers, short circuiting of the device, and incomplete or uneven deposition of the semiconductor layers due to the geometry of the grid.

U.S. Pat. No. 4,808,242 to Murata et al. discloses a photovoltaic device having a substrate on which a plurality of transparent electrodes for each photoelectric conversion cell are arranged. Each transparent electrode has a coupling conductor and a plurality of collecting electrodes connected to the coupling conductor. Although the Murata et al. device includes a transparent current collecting network, and thus avoids the problems associated with a non-optically transparent system, it is difficult and expensive to produce due to the additional materials and processing steps required to integrate the intricate arrangement of electrodes and coupling conductors.

It is desirable to create a transparent conducting film between the substrate and the first semiconductor layer that has both low electrical sheet resistance and high optical transmission. Low sheet resistance is a primary requirement of any contact on a semiconductor device to reduce the barrier to carrier flow between the semiconductor device and the external electronic circuit. High optical transmission is also very important to increase the amount of electromagnetic radiation that is absorbed by the semiconductor material, thereby optimizing the operation of the photovoltaic device by maximizing the number of photogenerated electrons available for collection. Unfortunately, it is difficult to provide both of these conditions simultaneously, low sheet resistance and high optical transmission, in the transparent conducting layer using conventional methods and TCO materials. As previously stated, conventional TCOs have high inherent resistivity. High sheet resistance causes ohmic losses in the transparent conducting film, which decreases the overall conversion efficiency of the device. To reduce the sheet resistance of these conventional TCO films, and thus potentially improve device performance, the TCO must be deposited as a relatively thick layer. However, the thicker the transparent conducting film, the lower the transmission and thus the less electromagnetic radiation that reaches the semiconductor material, thereby reducing the conversion efficiency of the solar cell.

Another disadvantage associated with conventional TCO layers in thin film solar cell devices is their generally rough surface morphology. For example, one of the most popular TCOs currently in use, tin oxide ($SnO_2$), when deposited as a thin film by chemical vapor deposition (CVD) typically produces an average surface roughness of between about 100 and 250 Å. Such high surface roughness has several significant disadvantages. First, it is well known that high efficiency solar cells (e.g., thin film CdS/CdTe solar cells) require a very thin semiconductor (CdS) window layer, typically with a thickness of around 600 Å. However, this high $SnO_2$ surface roughness coupled with a thin CdS layer can significantly affect the uniformity of both the CdS layer and the resulting $CdS_{1-x}Te_x$ intermixed layer, which will be described in more detail below. If the CdS and $CdS_{1-x}Te_x$ layers are not uniform or complete, this has the adverse effect of increasing interface defects thus reducing open circuit voltage and fill factor, and can ultimately cause severe degradation. Second, a high surface roughness increases the junction area of the solar cell which causes an increased dark current, and hence a lower open circuit voltage and fill factor. Finally, it is desirable to create a smooth surface on the transparent conducting film so that the thickness of the semiconductor window layer can be minimized. Having a very thin window layer means more absorption of optical photons (particularly energy of short wavelength) in the active region of the semiconductor device, and thus improved photovoltaic conversion efficiency.

Another problem with conventional $SnO_2$ is that they can be very difficult to pattern, which limits their commercial applications. It is especially important for commercial applications that the transparent conducting film be easy to pattern or etch, particularly for advanced module and display device processing. Transparent conducting films suitable for commercial use must also be easy to produce, inexpensive, durable, stable under standard processing conditions, and chemically compatible with the semiconductor material, specifically the CdS window layer.

A need therefore exists for an improved, high efficiency, thin film photovoltaic device. This improved device should include a transparent conducting film (TCO) which features a variety of desirable optical, electronic and mechanical properties. Specifically, the transparent conducting layer should exhibit high electrical conductivity, high optical transmission, relatively smooth surface morphology, good chemical and environmental stability, be easy and inexpensive to produce, and be easily patternable for module production. Ideally, this high efficiency device should have a front contact with a sheet resistivity as low as 2–5 ohms per square and an optical transmittance greater than 85 percent. Until this invention, no such device existed.

SUMMARY OF THE INVENTION

Accordingly, it is a general object of this invention to provide a thin film photovoltaic device having improved optical and electrical properties.

It is a more specific object of this invention to provide a thin film solar cell having a highly conductive TCO layer.

It is a further object of this invention to provide a thin film solar cell having a TCO layer with high optical transmission.

It is yet another object of this invention to provide a thin film solar cell having a TCO layer with low sheet resistance at thicknesses necessary for good optical transmission.

It is a more specific object of this invention to provide a thin film solar cell having a TCO layer with a sheet resistance less than 3 ohms per square and an optical transmittance greater than about 85 percent.

It is another object of this invention to provide a thin film solar cell having a TCO layer with a low sheet resistance, and hence an efficient current collector, at solar cell sizes greater than about one square centimeter.

It is a yet further object of this invention to provide a thin film solar cell having a TCO layer with low surface roughness.

It is a still further object of this invention to provide a thin film solar cell having a TCO layer which is highly stable.

It is yet another object of this invention to provide a thin film solar cell having a TCO layer which is easily patternable.

It is another general object of this invention to provide a photovoltaic device having all of the above attributes.

It is yet another general object of this invention to provide a method for making a photovoltaic device having all of the above attributes.

To achieve the foregoing and other objects and in accordance with the purposes of the present invention, as embodied and broadly described therein, the articles of manufacture of this invention may comprise a substrate, a layer of cadmium stannate ($Cd_2SnO_4$ or "CTO") disposed on said substrate as a front contact, a thin film comprising two or more layers of semiconductor materials disposed on said layer of $Cd_2SnO_4$, and an electrically conductive film disposed on said thin film of semiconductor materials to form a rear electrical contact to said thin film.

To further achieve the foregoing and other objects and in accordance with the purposes of the present invention, as embodied and broadly described therein, one embodiment of this invention comprises a process for preparing a photovoltaic device having a layer of $Cd_2SnO_4$ as a front contact. The method of this invention includes depositing a $Cd_2SnO_4$ layer onto a substrate, depositing a thin film of semiconductor materials onto the layer of $Cd_2SnO_4$, and depositing an electrically conductive film onto the thin film of semiconductor materials.

BRIEF DESCRIPTION OF THE DRAWINGS

The accompanying drawings, which are incorporated in and form a part of the specifications, illustrate the preferred embodiments of the present invention, and together with the descriptions serve to explain the principles of the invention. In the Drawings.

DETAILED DESCRIPTION OF THE PREFERRED EMBODIMENTS

Figure 1:
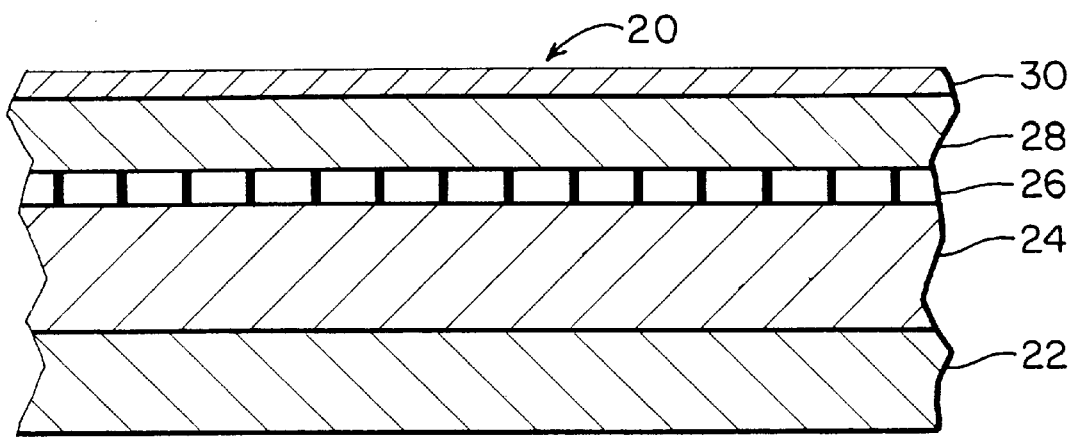
FIG. 1 is a cross-sectional view (not in actual scale or proportion) of a photovoltaic device, such as a solar cell, in accordance with the present invention.

FIG. 1 shows a cross-sectional view of a photovoltaic device of the present invention. The photovoltaic device generally referred to by reference number 20 comprises a transparent substrate 22 through which radiant energy enters the device. A thin transparent conducting oxide (TCO) film of cadmium stannate ($Cd_2SnO_4$) 24 is deposited onto the transparent substrate 22 and is contiguous thereto. The cadmium stannate film 24 is deposited between the transparent substrate 22 and the first semiconductor layer 26 (described below) to function as a front contact current collector. The cadmium stannate film 24 thus replaces the conventional TCO films commonly used in photovoltaic devices. A first semiconductor layer 26 is disposed on the cadmium stannate film 24 and a second semiconductor layer 28 is disposed on the first semiconductor layer 26. The conductivity types of semiconductor layers 26 and 28 are not the same. A back electrical contact 30 is disposed over the second semiconductor layer 28 and in ohmic contact therewith.

The illustrations of photovoltaic device 20 and its various portions or components in FIG. 1 are not intended to be drawn to scale or even in proportion, because the very thin components and layers of the photovoltaic device 20 are impractical, if not impossible, to illustrate to scale or in proper proportion. Therefore, this figure is for illustrative purposes only, as will be understood by persons skilled in this art.

The present invention also provides a method of making a photovoltaic device 20, which method includes depositing a film of cadmium stannate 24 onto a transparent substrate 22. The cadmium stannate film 24 is formed by RF sputtering a layer of substantially amorphous $Cd_2SnO_4$ onto a suitable transparent substrate 22. A layer of CdS is formed on a second substrate (not shown), such as soda lime glass, by a suitable technique, such as RF sputtering or chemical bath deposition. The coated CdS layer is placed in contact with the $Cd_2SnO_4$ layer and heated to a treatment temperature sufficient to induce crystallization of the $Cd_2SnO_4$ layer. The resulting uniform, crystalline cadmium stannate film 24 has significantly improved electrical and optical properties when compared to the properties of previously available TCO films. The above-described method for depositing a film of cadmium stannate 24 onto a transparent substrate 22 is described in a related copending U.S. patent application entitled "Thin Transparent Conducting Films of Cadmium Stannate," which is incorporated by reference herein. Following deposition of the cadmium stannate film 24, at least two semiconductor materials of differing conductivity types (semiconductor layers 26 and 28) are deposited on the cadmium stannate film 24 to function as a semiconductor for the device 20.

For the purpose of providing a detailed description and an enabling embodiment, but not for the purpose of limitation, this description refers to a first semiconductor layer 26 of CdS and a second semiconductor layer 28 of CdTe. However, the present invention can be practiced using any suitable combination of semiconductor materials of differing conductivity types including, but not limited to, CdS/CdTe, CdS/HgCdTe, CdS/CdZnTe, and CdS/ZnTe.

As is apparent to one skilled in the art, the substrate 22 for the cadmium stannate film 24 must be optically transparent over the range of light wavelengths for which transmission through the substrate is desired. Suitable transparent substrates 22 allowing transmission of visible light include silica and glass. Also, the transparent substrate 22 must be of a material capable of withstanding heat treatment at temperatures of 550° C. or more, as described below, and the cadmium stannate film 24 must adhere to the transparent substrate 22 material. The thermal expansion coefficient of the transparent substrate 22 must be close enough to the thermal expansion coefficient of the cadmium stannate film 24 to prevent cracking or buckling of the cadmium stannate film 24 during heat treatment.

In accordance with the present invention, a cadmium stannate film 24 is created by RF sputtering from a hot-pressed target containing stoichiometric amounts of $SnO_2$ and CdO onto the transparent substrate 22. The sputtering can be conducted in substantially pure oxygen which is substantially free of impurities which could react with the metal oxides present. Preferably, the oxygen is 99.999% pure. It is also preferred that the sputtering is at room temperature. As deposited by RF sputtering, the $Cd_2SnO_4$ layer is yellowish in color and substantially amorphous. As is apparent to one skilled in the art, higher transmittance is obtained with a thinner film, and lower sheet resistance is obtained with a thicker film.

The CdS layer may be formed on a second substrate (not shown) by any method known to those skilled in the art. For example, the CdS layer may be formed by chemical bath deposition or sputtering. Although there is no maximum layer thickness, the coating should be thick enough for reuse. The CdS layer must also have a smooth surface and be uniform and free of pinholes.

The second substrate may be any material known to those skilled in the art which is capable of withstanding heat treatment up to 550° C. or more. The material must be one to which CdS will adhere. Also, the coated substrate must have a CdS layer surface which is sufficiently flat to make good contact with the $Cd_2SnO_4$ layer, as described below. Further, the second substrate must not react chemically with CdS at the treatment temperature. A suitable, inexpensive substrate is soda lime glass.

The $Cd_2SnO_4$ and CdS layers are then placed in contact with each other in an environment substantially free of water and oxygen. Water and oxygen cause stains in the cadmium stannate film 24 which inhibit its optical and electrical properties. In this method, a suitable environment is flowing argon at ambient pressure. The substrates and layers are then heated for a period of time sufficient for the $Cd_2SnO_4$ layer to form a uniform single-phase layer of $Cd_2SnO_4$ with a spinel crystal structure, substantially free of CdO, SnO2 and $CdSnO_3$ phases. This uniform single-phase layer of $Cd_2SnO_4$ is referred to herein as the "cadmium stannate film 24," as distinguished from the layer of substantially amorphous $Cd_2SnO_4$ prior to treatment, which is generally referred to herein as the "$Cd_2SnO_4$ layer." The treatment temperature should be low enough to prevent softening and damage to the transparent substrate 22. Although higher temperatures result in superior cadmium stannate film 24 properties, satisfactory films have been obtained at temperatures less than 600° C. Twenty minutes was found to be a satisfactory period for treatment in laboratory experiments. Cadmium stannate films 24 prepared by the method described herein and having thicknesses of about 0.5 microns were found to have desirable optical and electrical properties.

After the heat treatment, the two substrates are cooled at a rate slow enough to avoid stress in the substrates and removed from each other. The transparent substrate 22 with its cadmium stannate film 24 is further processed to produce the photovoltaic device 20 of the present invention, as described below. The second substrate with its CdS layer may be reused until the CdS layer is too thin to perform properly. The second substrate may then be re-coated with a new layer of CdS and reused.

Figure 2:
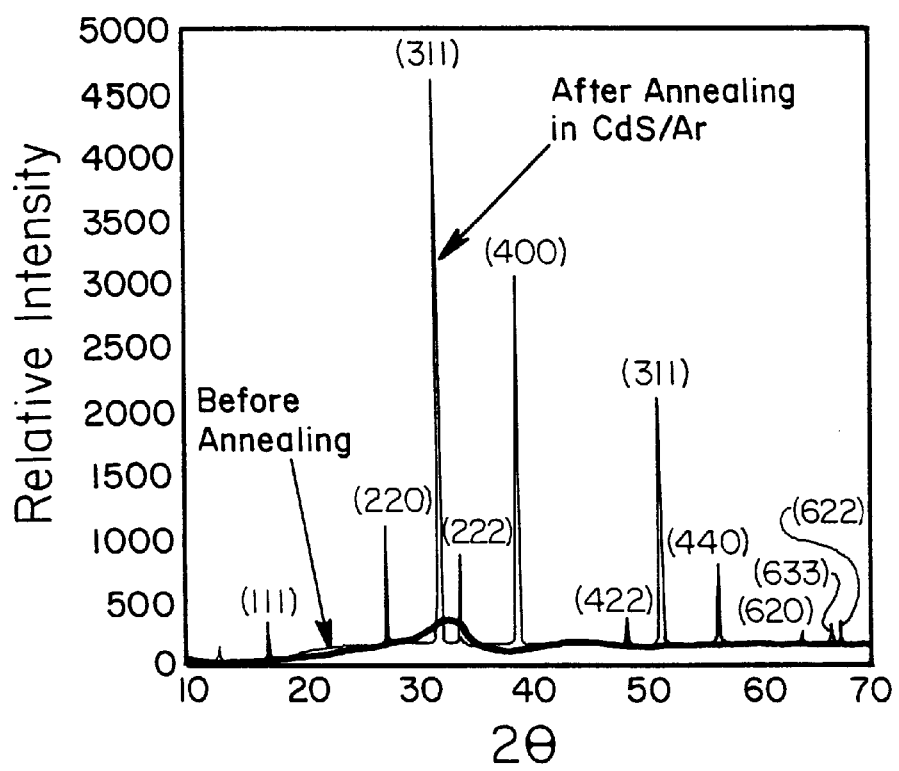
FIG. 2 is a graph showing the relative intensities of x-ray diffraction peaks as a function of 2 theta for a $Cd_2SnO_4$ layer prior to heat treatment and the cadmium stannate film after treatment.

It is believed that during the heat treatment, CdS vapor is sublimated from the CdS layer and diffuses into the $Cd_2SnO_4$ crystal lattice, creating interstitial cadmium and oxygen vacancies and reducing the quantity of secondary phases present. FIG. 2 shows a comparison of the X-ray diffraction patterns for the amorphous $Cd_2SnO_4$ layer prior to heat treatment and the cadmium stannate film after treatment. The data indicate a single-phase spinel crystal structure having a slightly larger lattice constant than $Cd_2SnO_4$ without interstitial cadmium.

Following cooling and separation from the CdS-coated second substrate, a first semiconductor layer 26 is deposited on the top surface of the cadmium stannate film 24. Contiguous to the first semiconductor layer 26 is a second semiconductor layer 28 having a conductivity type that is different from the conductivity type of first semiconductor layer 26. A back electrical contact 30 is disposed over the second semiconductor layer 28 and in ohmic contact therewith. The semiconductor layers 26 and 28 and the back contact 30 may be formed by any known process, such as chemical bath deposition, vapor deposition, electro-deposition, and the like. Preferably, the first semiconductor layer 26 is deposited by a chemical bath deposition and the second semiconductor layer 28 is deposited by close-space sublimation, as described in the Examples hereof.

The photovoltaic device 20 may include an electrical contact or electrode pad (not shown) on the cadmium stannate film 24, the function and construction of which is known in the art and not a part of this invention. The photovoltaic device 20 may further include an anti-reflective (AR) coating (not shown) on the front surface of the transparent substrate 22 to enhance the initial transmission of light into the semiconductor material, which is also known in the art and not a part of this invention.

A significant advantage associated with the photovoltaic device of the present invention is the improved device performance due to the high conductivity of the cadmium stannate film. As will be appreciated by those of skill in the art, the conductivity of the transparent conducting film can be improved by increasing either the carrier concentration or the electron mobility. Surprisingly, however, the transparent conducting films in the photovoltaic devices of the present invention exhibit unusually high electron mobilities, even at high carrier concentrations. Although the basis for this observation is not fully understood, it is believed that during the heat treatment, CdS vapor is sublimated from the CdS layer and diffuses into the $Cd_2SnO_4$ crystal lattice, creating interstitial cadmium and oxygen vacancies and thus generating free electrons.

Table 1 compares the thicknesses and electrical properties of two commercially available $SnO_2$ films, a $SnO_2$ film prepared using a tetramethyltin (TMT) process, and cadmium stannate films prepared as described in Example 1 below. In the table, $R_s$ is the sheet resistivity, $\mu$ is electron mobility, n is the charge carrier concentration, and $\rho$ is the resistivity. All values reported in Table 1 were obtained in the same laboratory using the same equipment and analytical techniques. Film thicknesses were determined from the position of neighboring interference maxima in optical transmittance curves, and cross checks were performed using a Dektak thickness profilometer. The values for n, $\mu$, and p were obtained by the Hall effect method, and $R_s$ was measured by the four-point probe technique.

TABLE I

| Sample (substrate) | Thickness (Å) | n (cm$^{-3}$) | $\mu$ (cm$^2$/Vs) | $\rho$ ($\Omega$-cm) | $R_s$ ($\Omega$/Sq.) |
|---|---|---|---|---|---|
| $Cd_2SnO_4$-1 (7059 glass) | 5100 | $8.94 \times 10^{20}$ | 54.5 | $1.28 \times 10^{-4}$ | 2.58 |
| $Cd_2SnO_4$-2 (soda-lime glass) | 5500 | $6.58 \times 10^{20}$ | 51.6 | $1.84 \times 10^{-4}$ | 3.2 |
| $SnO_2$-1 (7059 glass) | ~10000 | $4.95 \times 10^{20}$ | 15.4 | $8.18 \times 10^{-4}$ | 8.6 |
| $SnO_2$-2 (soda-lime glass) | ~3400 | $4.19 \times 10^{20}$ | 33.0 | $4.53 \times 10^{-4}$ | 13.4 |
| $SnO_2$-3 (7059 glass) | ~10000 | $4.52 \times 10^{20}$ | 42.0 | $3.29 \times 10^{-4}$ | 3.3 |

As shown in Table 1, even at a carrier concentration of about $9 \times 10^{20}$ cm$^{-3}$, the mobility remains high (about 55 cm$^2$/Vs). These mobilities are substantially higher (approximately two to three times higher) than conventional $SnO_2$ films doped to similar levels.

Also as shown in Table 1, the resistivity of cadmium stannate films is significantly lower (approximately two to six times lower) than that of conventional $SnO_2$ films deposited on similar substrates. Thus, the photovoltaic devices of the present invention offer the important advantage of reduced series resistance and increased fill factor, and hence improved efficiency, due to the presence of these low-resistivity cadmium stannate films. Although this advantage applies to both small and large-area photovoltaic devices, reducing the series resistance in commercial modules is of particular interest, since the distance between laser scribe lines can be significantly increased without significant resistive power losses. Moreover, because the distance between scribe lines is increased, fewer scribe lines are required, thus improving throughput and reducing manufacturing costs.

Another significant advantage associated with the photovoltaic device of the present invention is the improved optical transmission and electrical resistance of the cadmium stannate film, as compared to existing devices comprising conventional TCO films. As previously discussed, conventional TCOs have high inherent sheet resistances, which causes ohmic losses in the transparent conducting film and reduces the efficiency of the device. Normally, to reduce the sheet resistance of these films, the thickness of the TCO layer must be increased, which decreases the optical transmission. Because of the superior conductivity of the cadmium stannate film, the TCO can be deposited in a thin layer, thereby improving the optical transmission and hence the amount of electromagnetic radiation that reaches the semiconductor material. Although the basis for this improvement is not fully understood, it is believed to result from the unusually high electron mobility of the cadmium stannate film, as previously discussed. Thus, the photovoltaic device of the present invention offers improved short circuit currents, and hence improved performance, over prior art devices.

Figures 4A, 4B:
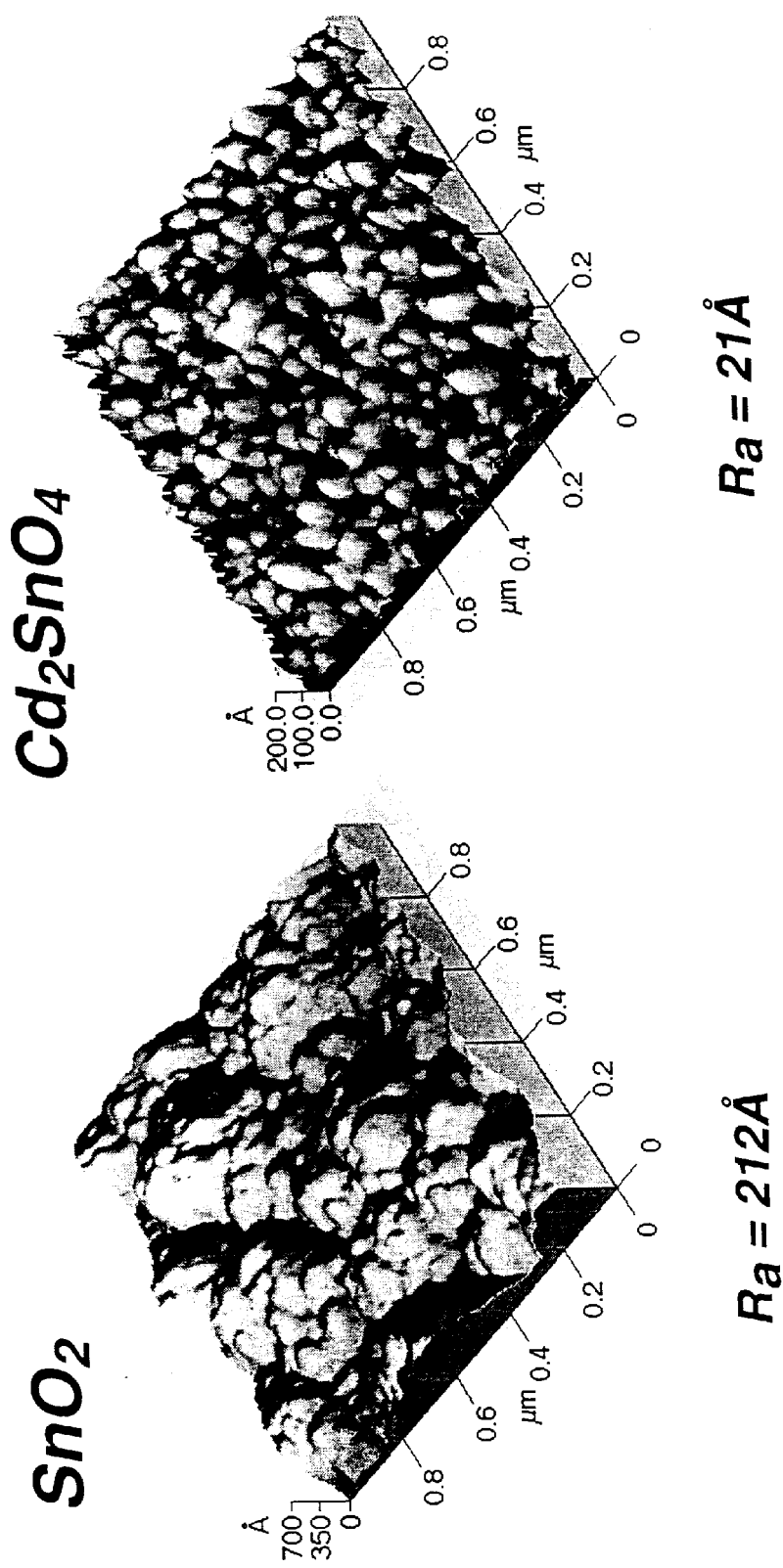
FIG. 4a is an atomic force micrograph showing the surface morphology of a conventional $SnO_2$ film.
FIG. 4b is an atomic force micrograph showing the surface morphology of a cadmium stannate film.

A yet further significant advantage of the photovoltaic device of the present invention is the improved surface morphology of the transparent conducting film, which provides improved device performance. FIG. 4 provides a comparison of the surface morphologies of a conventional $SnO_2$ film (FIG. 4a) and a cadmium stannate film (FIG. 4b). As can be seen in FIG. 4, the surface of the cadmium stannate film is significantly smoother than the surface of the $SnO_2$ film. Data obtained from atomic force micrography indicate that the average surface roughness of the cadmium stannate film is an order of magnitude lower than that of the $SnO_2$ film. It is well known that in a heterojunction solar cell, reducing the window layer absorption increases short circuit current ($J_{sc}$). In CdS/CdTe solar cells, this is typically achieved by reducing the CdS thickness (C. Ferekides, et al., 23rd IEEE SPVC Proc. (1993) pp. 389–393). In general, a CdS/CdTe solar cell with a thin CdS layer has much better spectral response in the blue. However, reducing the thickness of the CdS film to between 600 Å and 700 Å can reduce the open circuit voltage and fill factor. During CdTe depositions and subsequent $CdCl_2$ heat-treatment, the CdS film is either partially or completely consumed forming a $CdS_{1-x}Te_x$ intermixed layer. The CdS consumption reportedly increases as the CdS film thickness decreases (B. E. McCandless and S. S. Hegedus, 22nd IEEE SPVC Proc. (1991) pp. 967–972). As the CdS film thins, pinholes can develop and create CdTe/TCO (specifically $CdTe/SnO_2$) junctions, which reduces the open circuit voltage and fill factor. The probability of pinhole formation increases, particularly for sputter deposited or CSS deposited CdS, as the $SnO_2$ surface roughness increases (A. Rohatgi, et al., 22nd IEEE SPVC Proc. (1991) pp. 962–966). Thus, because of the considerable improvement in surface morphology of cadmium stannate films and the concomitant reduction in pinhole formation, the photovoltaic device of the present invention provides a significant improvement in device performance.

Figure 5:
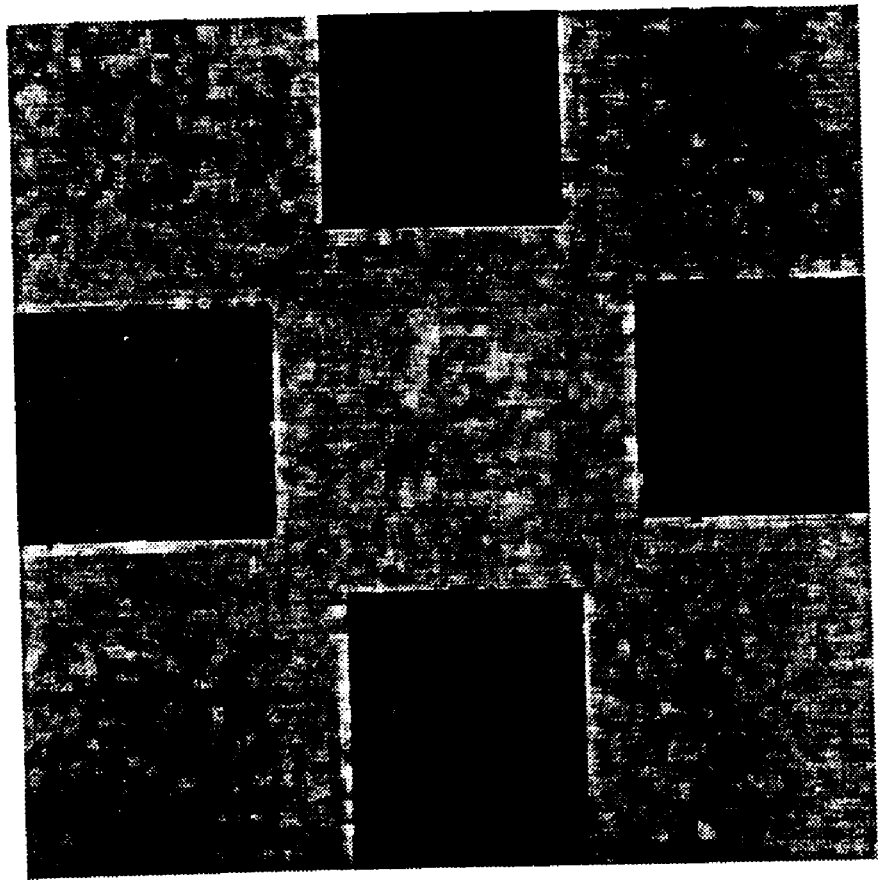
FIG. 5 is an optical micrograph of a photolithographically patterned cadmium stannate film which was etched in dilute HCl for 2 minutes.

Cadmium stannate films are also much easier to pattern than conventional $SnO_2$ films (by etching in either HCl or HF), thus facilitating production and significantly expanding commercial applications of the photovoltaic device of the present invention. FIG. 5 shows a photolithographically patterned cadmium stannate film which was etched in dilute HCl for 2 minutes. As shown in FIG. 5, cadmium stannate films provide excellent edge definition, which is particularly important for certain commercial applications, such as in advanced photovoltaic module and flat panel display device processing.

The photovoltaic device of the present invention is also more durable and stable (chemically and thermally) than existing devices due to the improved mechanical properties of the cadmium stannate film. In particular, cadmium stannate films deposited on glass substrates have good adhesion, are reasonably hard and scratch resistant, and exhibit high stability at elevated temperatures and over long periods of time. Moreover, the cadmium stannate films are less affected by post-deposition processing (i.e., $CdCl_2$ heat-treatment) than conventional TCO films, thus improving process reproducibility and product yield. Finally, the photovoltaic device of the present invention is also economically advantageous. Highly efficient thin film devices can be produced using low cost substrates, such as soda lime glass substrates, thus reducing production costs.

The following examples demonstrate the practice and utility of the present invention but are not to be construed as limiting the scope thereof. Any suitable laboratory equipment known to those skilled in the art can be utilized to fabricate films and solar cells and analyze electrical and optical properties. In the examples, $Cd_2SnO_4$ layers are deposited onto substrates using a modified SC-3000 evaporation system, manufactured by CVC Products, Inc. Optical measurements are made with a Cary 2300 spectrophotometer, manufactured by Varian Company.

EXAMPLE 1

Thin films of cadmium stannate were prepared by RF magnetron sputtering. The sputtering was carried out at room temperature in a modified SC3000 evaporation system, evacuated to a background pressure of ~$5\times10^{-7}$ Torr and then backfilled with high purity oxygen. Corning 7059 glass substrates (sample $Cd_2SnO_4$-1) and soda-lime glass substrates (sample $Cd_2SnO_4$-2) were placed on a water-cooled sample holder parallel to the target surface. The distance between the substrate and the target was varied from 6 to 9 cm. The targets (33 mol % $SnO_2$ and 67 mol % CdO) were reacted using a commercial hot pressed oxide target. X-ray diffraction showed that the target was single-phase orthorhombic $Cd_2SnO_4$. Deposition was performed at an oxygen partial pressure of 10–20 mTorr with the RF power between 100 and 140 Watts, providing an average deposition rate of about 10 nm min$^{-1}$.

Sample $Cd_2SnO_4$-1 was heated at 680° C. and sample $Cd_2SnO_4$-2 was heated at between 580° and 600° C. for about 20 minutes in a tube furnace containing argon of 99.999% purity flowing at a rate of 1500 sccm. The samples were placed in contact with a CdS-coated glass substrate during the heat treatment. The CdS was previously deposited by chemical bath deposition as a thin layer on a glass substrate.

FIG. 2 compares X-ray diffraction patterns obtained with a DMAX-A X-ray diffractometer, manufactured by Rigaku Company. The pattern of the as-deposited $Cd_2SnO_4$ layer shows an amorphous structure. In contrast, the diffraction pattern of the $Cd_2SnO_4$ film after the Ar/CdS heat treatment indicates a single-phase, cubic spinel crystal structure. There is no evidence that secondary phases, such as CdO, $SnO_2$, and $CdSnO_3$ form in these films after crystallization.

Table 1 provides the electrical properties of the cadmium stannate films, two commercially available $SnO_2$ films, and a film obtained from Dr. Christopher Ferekides at the University of South Florida (Sample USF), which was prepared using a tetramethyltin (TMT) process similar to that described by J. Proscia and R. G. Gordon, Thin Solid Films, 214 (1992), pp. 175–187. As evident from Table I, the cadmium stannate films have a lower resistivity ($\rho$) and higher mobility ($\mu$) and carrier density (n) than $SnO_2$ films of comparable thickness.

Figure 3A:
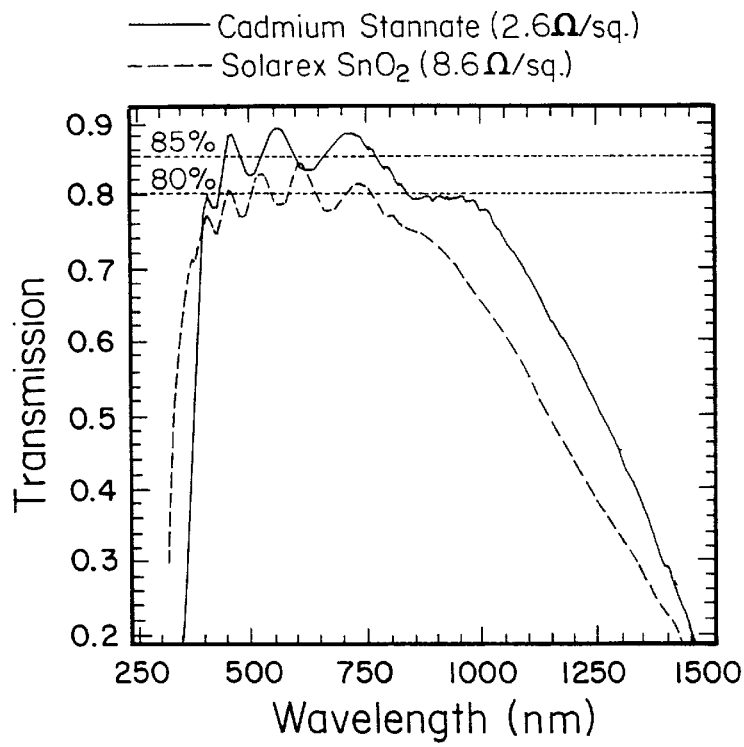
FIG. 3a is a graph showing the transmittance for the cadmium stannate film shown in FIG. 2 and a commercially available $SnO_2$ thin film.
Figure 3B:
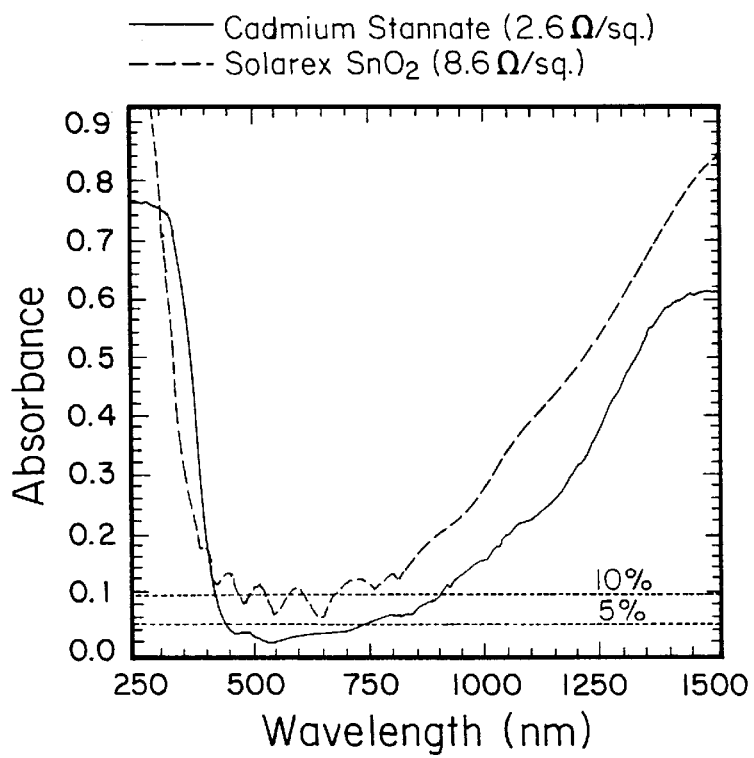
FIG. 3b is a graph showing the absorbance for the cadmium stannate film shown in FIG. 2 and a commercially available $SnO_2$ thin film.

FIGS. 3a and 3b compare the transmittance (T) and absorbance (A), respectively, of a cadmium stannate film (Sample $Cd_2SnO_4$-1) and a commercially available $SnO_2$ thin film deposited on Corning 7059 glass (Sample $SnO_2$-1), manufactured by Solarex Corp. (Thin Film Division, 826 Newton Yaraley Road, Newton, Pa. 18940). The cadmium stannate film has a higher average transmittance (about 85 percent) over the visible portion of the spectrum as compared to the $SnO_2$ film, even though the cadmium stannate film has a much lower resistivity. As can also be seen in FIGS. 3a and 3b, the cadmium stannate film has a lower absorbance in the visible range as compared to the $SnO_2$ film, even at a carrier concentration of about $9\times10^{20}$ cm$^3$.

FIG. 4 shows atomic force micrographs of the surface of both a cadmium stannate film (Sample $Cd_2SnO_4$-1) and a $SnO_2$ thin film (Sample $SnO_2$-1). The $SnO_2$ thin film (FIG. 4a), deposited by atmospheric pressure chemical vapor deposition using a $SnCl_4$ chemistry, has an average surface roughness of 212 Å. In contrast, the $Cd_2SnO_4$-1 thin film (FIG. 4b) has a very smooth surface with an average surface roughness of 21 Å, which is an order of magnitude lower than that of the $SnO_2$ film.

FIG. 5 shows a photolithographically patterned cadmium stannate film ($Cd_2SnO_4$-1) which was etched in dilute HCl for 2 minutes. Cadmium stannate films can be easily patterned by etching in either HCl or HF, with excellent edge definition.

EXAMPLE 2

Figure 6:
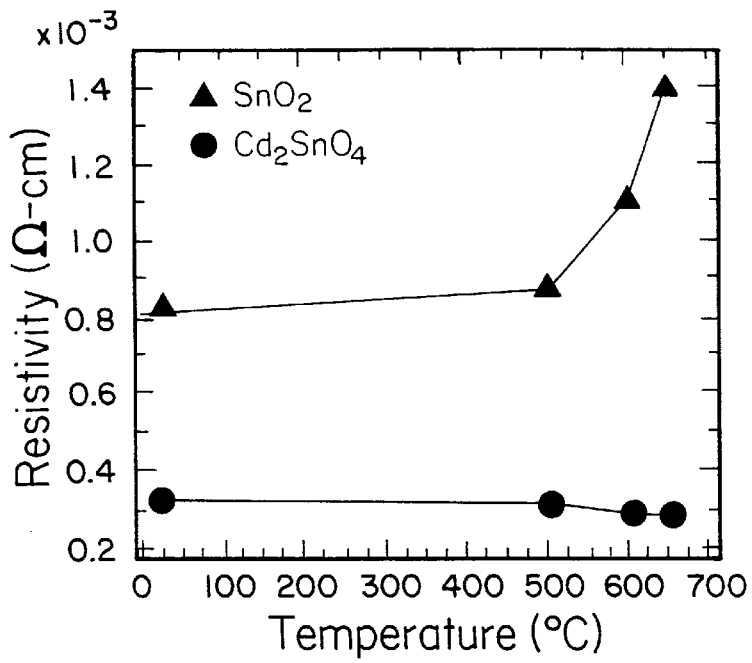
FIG. 6 is a graph of resistivity as a function of temperature for the cadmium stannate and $SnO_2$ films shown in FIGS. 3 and 4.

A film of cadmium stannate ($Cd_2SnO_4$-1) is prepared as described in Example 1 and heat treated in argon for 20 minutes. The thermal stability of the cadmium stannate film was compared to a similarly treated $SnO_2$ thin film (Sample $SnO_2$-1). As indicated in FIG. 6, the resistivity of the $SnO_2$ film degrades when annealed at temperatures in excess of 500° C. In contrast, the cadmium stannate thin film is extremely stable at temperatures as high as 650° C.

EXAMPLE 3

A film of cadmium stannate ($Cd_2SnO_4$-1) was prepared as described in Example 1 and subjected to a residual gas analysis to determine the temperature stability of the film with respect to release of cadmium. The sample was heated to 400K at a pressure of $10^{-5}$ Torr in a UTI 100C Precision Gas Analyzer, manufactured by Uthe Technology International. No cadmium-containing gaseous species were detected, up to the detection limit of the technique. Thus, the cadmium stannate film is stable and does not decompose readily at elevated temperatures such as those likely to be encountered in most uses of TCO films.

EXAMPLE 4

A film of cadmium stannate ($Cd_2SnO_4$-1) was prepared as described in Example 1 and heat treated in contact with a layer of CdS at 680° C. The film was stored at room temperature, and the sheet resistance of the film was measured periodically during the year. No change in sheet resistivity ($R_s$) was observed, indicating that the cadmium stannate film properties are stable over extended periods of time.

EXAMPLE 5

To compare the electrical properties of the photovoltaic devices of the present invention with those of conventional devices, two sets of thin film CdS/CdTe solar cells comprising either cadmium stannate or $SnO_2$ TCO films were fabricated and analyzed using identical methods, as described below.

Films of cadmium stannate ($Cd_2SnO_4$-1) were prepared as described in Example 1; $SnO_2$ thin films (Sample $SnO_2$-1, Table 1) were purchased from Solarex Corp. (Thin Film Division, 826 Newton Yaraley Road, Newton, Pa. 18940).

A first semiconductor window layer of CdS was deposited on the top surface of the respective films by a chemical bath deposition (CBD) technique using $CdAc_2$, $NH_4Ac$, $NH_4OH$ and thiourea in an aqueous solution. Prior to CdS deposition, the substrates with a $SnO_2$ layer were cleaned using a 1% Liquinox in hot DI (deionized) water with thorough rinsing (5 minutes running DI water, 5 sonications in fresh DI, one sonication in hot DI). Substrates with a cadmium stannate film were cleaned by rinsing with TCE, then acetone, then IPA, followed by thorough rinsing.

The substrates were loaded into a quartz holder in a jacketed beaker and the chemical deposition bath was prepared as follows: (1) 550 mL of water was added to the jacketed beaker and was heated to 86–87° C. using a recirculator; (2) 8 mL of a 0.033M (8.88 g/l) cadmium acetate solution was added; (3) 5.3 mL of a 1M (77.08 g/l) ammonium acetate solution was added; (4) 15 mL of a stock (30%) ammonium hydroxide solution was added slowly, using a pipette; and (5) 8 mL of a 0.067M (5.07 g/l) thiourea solution was added in four 2 mL aliquots with a 10 minute interval between each addition. During the entire procedure a magnetic stir bar was used to stir the solution. The jacketed beaker was kept covered to preserve temperature uniformity and pH level. Ten minutes after the final thiourea addition, the substrates were taken out and rinsed three times by sonication in warm DI water. The CdS films are 800–1000 Å thick and have an index of refraction of about 2.3. The CdS films were then pre-treated in $H_2$ at 400° C. for 15 minutes.

Following the CdS anneal, approximately 10 microns of CdTe was deposited on the CdS films by close-space sublimation (CSS), as described by C. Ferekides, et al., 23rd IEEE SPVC Proc. (1993) pp. 389–393). During CSS deposition, the substrate and source temperatures were 600° C. and 660° C., respectively. The distance between the substrate and the source was 0.2 cm, and the ambient pressure was 15 Torr (0.5 Torr $O_2$ and 14.5 Torr He). After CSS deposition, the substrates were soaked in either a 25% or 75% saturated solution of $CdCl_2$ at approximately 55° C. for 15 minutes, where the saturated solution was 7.5 g cadmium chloride dissolved in 500 cc methanol. The devices were then annealed at 400° C. for 30 minutes in a tube furnace with a $He/O_2$ mixture (100 sccm He and 25 sccm $O_2$). Following this anneal, HgTe doped graphite paste and silver paste back contacts were deposited on the devices. A 1000 Å $MgF_2$ anti-reflection (AR) coating was deposited on smaple $Cd_2SnO_4$-1.

The photovoltaic device structure is shown in FIG. 1. In the devices of the present invention, the cadmium stannate film replaces the $SnO_2$ layer as the front contact. In the exemplified devices, the thickness of the cadmium stannate film was between 0.5 and 0.6 microns, with a sheet resistivity of about 3Ω/square. However, as will be appreciated by those of skill in the art, the thickness of the cadmium stannate film can be varied as appropriate for the particular application. A thinner film provides a higher transmittance, and a thicker film provides a lower sheet resistance. Thus, when minimizing sheet resistance is more important than optimal transmission, the thickness of the cadmium stannate film can be increased accordingly. Alternatively, the film thickness can be minimized, thereby increasing the sheet resistance, when optimal transmission is required. Preferably, the cadmium stannate film is between about 0.2 and 2.0 microns thick, more preferably between about 0.3 and 0.7 microns thick, and most preferably about 0.5 microns thick. The cadmium stannate film preferably has a sheet resistivity less than about 10 ohm/square, and more preferably less than about 4 ohm/square. The thickness of the CdS layer was between 800 and 1000 Å, and the CdTe film thickness was about 10 microns.

Figure 7:
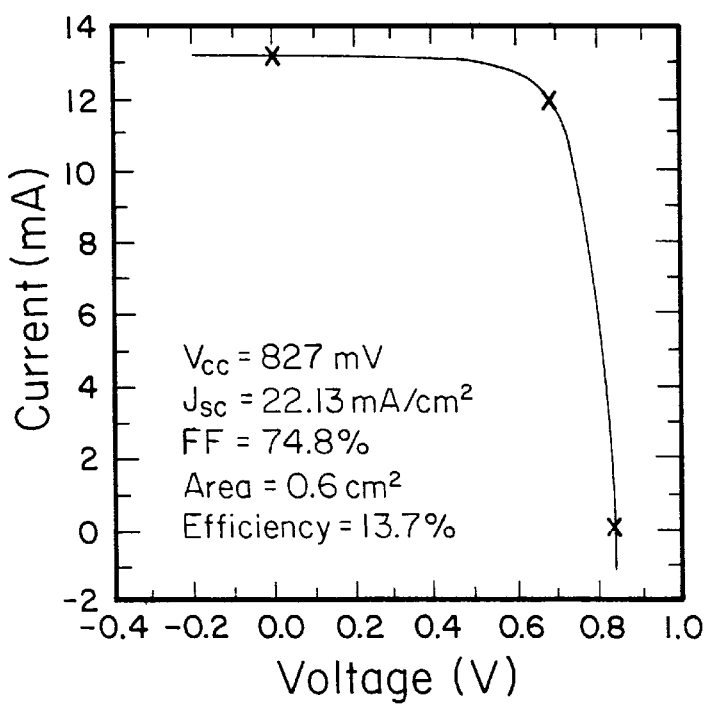
FIG. 7 is a graph of current and voltage for a photovoltaic device of the present invention.

FIG. 7 provides an I-V curve for a cadmium stannate-based CdS/CdTe thin film solar cell. The electrical properties and performance data for the device shown in FIG. 7 are as follows: open circuit voltage ($V_{oc}$)=0.8268 V; $V_{max}$=0.6831 V; $I_{sc}$=13.29 mA; $I_{max}$=12.03 mA; $J_{sc}$=22.13 mAcm$^{-2}$; $P_{max}$=8.217 mW; fill factor=74.80%; and efficiency=13.7%. In general, cadmium stannate-based cells have higher fill factors than $SnO_2$-based devices, probably due to the low resistivity of cadmium stannate films. This improved fill factor is particularly advantageous to large area CdS/CdTe modules.

Figure 8:
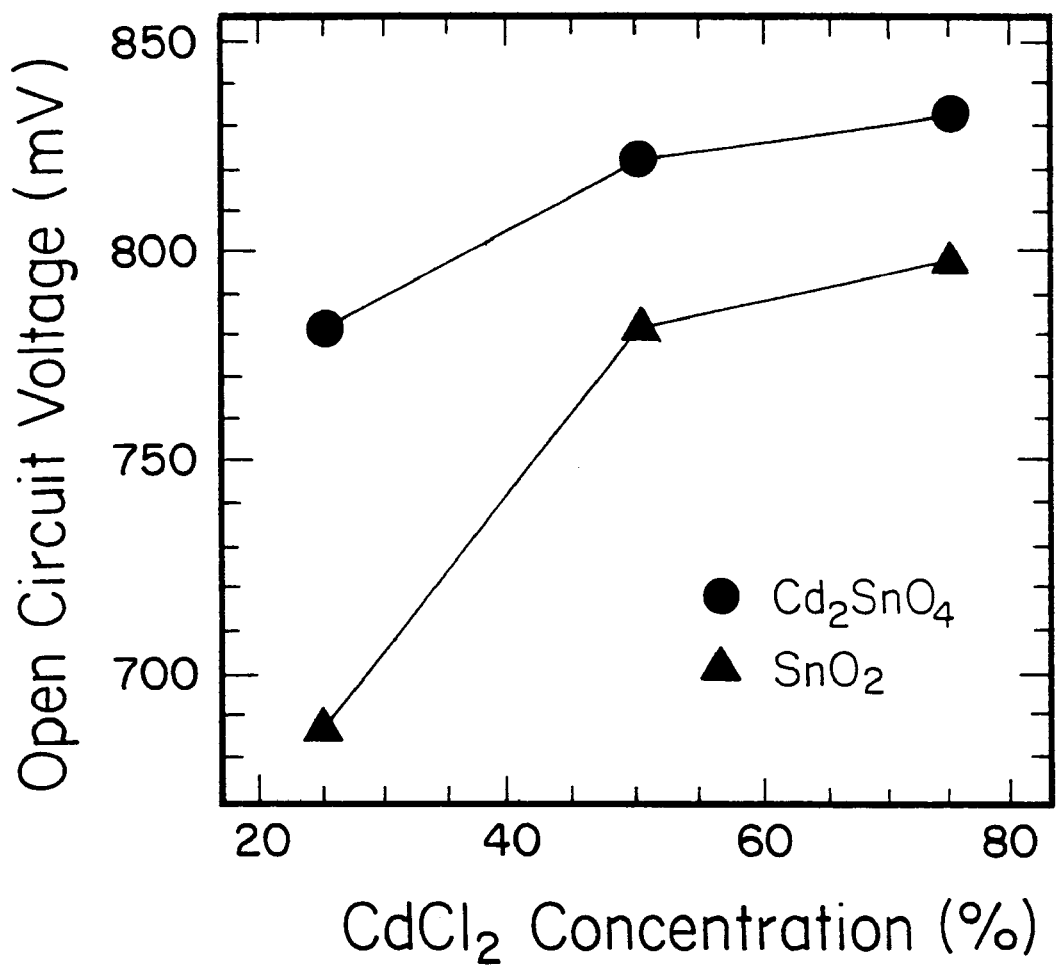
FIG. 8 is a graph of open circuit voltage as a function of $CdCl_2$ concentration for a set of photovoltaic devices of the present invention and a set of photovoltaic devices comprising a commercially available $SnO_2$ thin film.

FIG. 8 compares the open circuit voltage ($V_{oc}$) of the cadmium stannate-based and $SnO_2$-based solar cells as a function of $CdCl_2$ concentration. As shown in this figure, the cadmium stannate-based device has a significantly higher $V_{oc}$ than the $SnO_2$-based device for any particular $CdCl_2$ concentration. This advantage likely results, in part, from the improved surface morphology of the cadmium stannate film, as previously discussed. However, the chemistry at the $Cd_2SnO_4$/CdS interface may also be an important contributing factor. FIG. 8 also indicates that the $V_{oc}$ of $Cd_2SnO_4$-based CdS/CdTe devices is less dependent on the $CdCl_2$ heat-treatment. Because the cadmium stannate films are less affected by post-deposition processing than conventional TCO films, the photovoltaic devices of the present invention provide improved process reproducibility and product yield.

EXAMPLE 6

To compare the thermal stability of the photovoltaic devices of the present invention with conventional devices, three sets of thin film CdS/CdTe solar cells comprising either cadmium stannate or $SnO_2$ TCO films were fabricated as described in Example 5. Films of cadmium stannate ($Cd_2SnO_4$-1) were prepared as described in Example 1; $SnO_2$ thin films (Sample $SnO_2$-1) were purchased from Solarex Corp. (Thin Film Division, 826 Newton Yaraley Road, Newton, Pa. 18940); and $SnO_2$ thin films (Sample $SnO_2$-3) were prepared by a TMT process similar to that described by J. Proscia and R. G. Gordon, *Thin Solid Films*, 214 (1992), pp. 175–187.

Table 2 compares the sheet resistance ($R_s$) of the three sets of CdS/CdTe cells before and after CSS CdTe deposition, as measured by a Tencor M-gauge. As can be seen in Table 2, only the cadmium stannate films provide a sheet resistivity of less than 3Ω/square following CSS deposition. The thermal stability of the photovoltaic devices of the present invention is a particularly significant advantage, since CSS deposition typically involves processing temperatures as high as 600° C.

TABLE 2

| TCO Material | Sample | $R_s$(Ω/square) Before CdTe deposition | After CdTe deposition |
| --- | --- | --- | --- |
| $SnO_2$-1 | S12 | 8.4 | 8.3 |
| (Solarex) | S8 | 8.2 | 8.1 |
| $SnO_2$-3 | U6 | 6.5 | 8.2 |
| (USF) | U3 | 6.7 | 8.3 |
| $Cd_2SnO_4$-1 | C4 | 2.6 | 2.5 |
| | C5 | 2.6 | 2.7 |

The foregoing description is considered as illustrative only of the principles of the invention. Further, since numerous modifications and changes will readily occur to those skilled in the art, it is not desired to limit the invention to the exact construction and process shown as described above. Accordingly, resort may be made to all suitable modifications and equivalents that fall within the scope of the invention as defined by the claims which follow.

The embodiments of the invention in which an exclusive property or privilege is claimed are defined as follows:

1. A thin-film photovoltaic device comprising:
    a substrate;
    a film of substantially single-phase $Cd_2SnO_4$ with a spinel crystal structure disposed on said substrate as a front contact;
    a thin film comprising two or more layers of semiconductor materials disposed on said film of $Cd_2SnO_4$; and
    an electrically conductive film disposed on said thin film of semiconductor materials to form a rear electrical contact to said thin film.

2. The photovoltaic device of claim 1, wherein said substrate is selected from the group consisting of silica and glass.

3. The photovoltaic device of claim 2, wherein said glass is soda-lime or borosilicate glass.

4. The photovoltaic device of claim 1, wherein said thin film of semiconductor materials comprises cadmium sulfide.

5. The photovoltaic device of claim 1, wherein said thin film of semiconductor materials comprises cadmium telluride.

6. The photovoltaic device of claim 1, wherein said substrate and said film of $Cd_2SnO_4$ are substantially transparent to light between about 400 nm and 1000 nm.

7. The photovoltaic device of claim 1, wherein said substrate is capable of transmitting light between the wavelengths of about 350 nm and 1000 nm.

8. The photovoltaic device of claim 1, wherein said film of $Cd_2SnO_4$ is between about 0.2 and 0.7 microns thick.

9. The photovoltaic device of claim 1, wherein said film of $Cd_2SnO_4$ is about 0.5 microns thick.

10. The photovoltaic device of claim 1, wherein said film of $Cd_2SnO_4$ has a sheet resistivity less than about 10 ohm/square.

11. The photovoltaic device of claim 10, wherein said sheet resistivity of said film of $Cd_2SnO_4$ is less than about 3 ohm/square.

12. The photovoltaic device of claim 1, wherein said film of $Cd_2SnO_4$ has an average optical transmission greater than about 80 percent throughout the range of about 400 nm to 1000 nm.

13. The photovoltaic device of claim 1, wherein said film of $Cd_2SnO_4$ has a mobility greater than about 50 $cm^2V^{-1}s^{-1}$.

14. The photovoltaic device of claim 1, wherein said film of $Cd_2SnO_4$ has a charge carrier density greater than about $6\times10^{20}$ $cm^{-3}$.

15. The photovoltaic device of claim 1, wherein said film of $Cd_2SnO_4$ has a resistivity less than about $2.0\times10^{-4}$ ohm-cm.

16. The photovoltaic device of claim 1, wherein said film of $Cd_2SnO_4$ has an average surface roughness of less than about 200 Å.

17. The photovoltaic device of claim 1, wherein said average surface roughness of said film of $Cd_2SnO_4$ is less than about 40 Å.

18. A method for making a photovoltaic device, the method comprising the steps of:
    forming a film of substantially single-phase $Cd_2SnO_4$ with a spinel crystal structure on a substrate;
    depositing a thin film of semiconductor materials onto said film of $Cd_2SnO_4$; and
    depositing an electrically conductive film onto said thin film of semiconductor materials to provide an electrical contact therewith.

19. The method of claim 18, wherein said step of depositing a film of $Cd_2SnO_4$ onto a substrate further comprises the steps of:
    (a) RF sputter coating a substantially amorphous $Cd_2SnO_4$ layer onto a first substrate;
    (b) coating a second substrate with a CdS layer;
    (c) contacting the $Cd_2SnO_4$ layer with the CdS layer in an environment essentially free of water and oxygen;

(d) heating the first and second substrates and the $Cd_2SnO_4$ and CdS layers to a treatment temperature sufficient to induce crystallization of the $Cd_2SnO_4$ layer into a uniform single-phase spinel structure, for a time sufficient to allow full crystallization of the $Cd_2SnO_4$ layer at the treatment temperature to produce a crystal $Cd_2SnO_4$ film;

(e) cooling the first and second substrates to room temperature; and (f) removing the first substrate with the $Cd_2SnO_4$ film from the second substrate and CdS layer.

20. The method of claim 19, wherein said substantially amorphous $Cd_2SnO_4$ layer is sputter coated onto said first substrate at room temperature.

21. The method of claim 19, wherein said substantially amorphous $Cd_2SnO_4$ layer is RF sputtered onto said first substrate in an atmosphere consisting essentially of oxygen.

22. The method of claim 19, wherein said treatment temperature is between about 500° C. and about 680° C.

23. The method of claim 22, wherein said treatment temperature is between about 580° C. and about 640° C.

24. The method of claim 23, wherein said treatment temperature is between about 580° C. and about 610° C.

25. The method of claim 19, wherein said CdS layer is sputter coated onto said second substrate.

26. The method of claim 19, wherein said CdS layer is deposited onto said second substrate by chemical bath deposition, close space sublimation or sputtering.

27. The method of claim 19, wherein said second substrate and said CdS layer are reused with a new first substrate and $Cd_2SnO_4$ layer.

28. The method of claim 19, wherein said second substrate is re-coated with a new layer of CdS and reused with a new first substrate and $Cd_2SnO_4$ layer.

29. The method of claim 19, wherein said first substrate is selected from the group consisting of silica and glass.

30. The method of claim 19, wherein said environment consists essentially of flowing argon.

31. The method of claim 18, wherein said step of depositing a thin film of semiconductor materials onto said layer of $Cd_2SnO_4$ comprises a chemical bath deposition.

32. A photovoltaic device produced by the method of claim 18.

* * * * *